(12) United States Patent
Kim

(10) Patent No.: US 6,256,244 B1
(45) Date of Patent: Jul. 3, 2001

(54) SELF REFRESH APPARATUS IN SEMICONDUCTOR MEMORY DEVICE

(75) Inventor: Joon Ho Kim, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/605,417

(22) Filed: Jun. 27, 2000

(30) Foreign Application Priority Data

Jun. 29, 1999 (KR) .................................................. 99-25367

(51) Int. Cl.$^7$ ...................................................... G11C 7/00
(52) U.S. Cl. .......................................... 365/203; 365/222
(58) Field of Search ................................. 365/203, 222, 365/207, 230.03, 230.06

(56) References Cited

U.S. PATENT DOCUMENTS

| | | | |
|---|---|---|---|
| 4,912,678 | 3/1990 | Mashiko | 365/222 |
| 5,412,604 | 5/1995 | Fukuda et al. | 365/189.11 |
| 5,418,754 | 5/1995 | Sakakibara | 365/222 |
| 5,652,723 | 7/1997 | Dosaka et al. | 365/189.01 |
| 5,798,976 | * 8/1998 | Arimoto | 365/222 |
| 5,995,434 | 11/1999 | Ryu | 365/222 |
| 6,038,186 | * 3/2000 | Tanizaki | 365/222 |

* cited by examiner

*Primary Examiner*—Vu A. Le
*Assistant Examiner*—Anh Phung
(74) *Attorney, Agent, or Firm*—Nath & Associates PLLC; Gary M. Nath

(57) ABSTRACT

Disclosed is a self refresh apparatus in a semiconductor memory device wherein sense amplifier connection signals are varied in logic level only when associated cell block selection signals vary in the self refresh mode, respectively. Accordingly, it is possible to reduce electric power consumed in a self refresh operation.

5 Claims, 6 Drawing Sheets

SELF REFRESH APPARATUS IN SEMICONDUCTOR MEMORY DEVICE

BACKGROUND OF THE INVENTION

1. Field of the Invention

The present invention relates to a self refresh apparatus in a semiconductor memory device, and more particularly to a self refresh apparatus for conducting a self refresh operation in a semiconductor memory device using a shared sense amplifier system.

2. Description of the Related Art

In a semiconductor memory device such as a DRAM, a memory cell thereof generally includes one capacitor and one MOS transistor. In such a configuration, there may be a problem in that a leakage of current may occur at a PN junction of the MOS transistor, so that the charge initially stored in the capacitor is lost, thereby causing a loss of data.

To this end, a refresh operation is periodically conducted before data is lost. In accordance with the refresh operation, data is read from the memory cell, and a recharge is carried out up to the initial amount of charges for the read data.

FIG. 1 is a block diagram illustrating a conventional self refresh apparatus in a DRAM using a shared sense amplifier system.

As shown in FIG. 1, the self refresh apparatus includes a refresh counter 10 for receiving an external clock signal CLK in a self refresh mode, and outputting word line selection signals WSA and cell block selection address signals BSAU and BSAD in response to the received clock signal CLK. The clock signal CLK is a signal for changing the state of the refresh counter 10 for every self refresh cycle. The cell block selection address signals BSAU and BSAD are adapted to select an up cell block 20 and a down cell block 22, respectively.

The self refresh apparatus also includes a block selection unit 12 for receiving a precharge signal PRECHG and the address signal BSAU, and outputting a word line activation signal BSXU, based on the received signals. The word line activation signal BSXU serves to activate the word lines of the up cell block 20. A block selection unit 14 is also provided which receives the precharge signal PRECHG and the address signal BSAD, thereby outputting a word line activation signal BSXD serving to activate the word lines of the down cell block 22.

The self refresh apparatus further includes a sense amplifier selection unit 16 which receives the word line activation signals BSXU and BSXD respectively from the block selection units 12 and 14, and connects a selected one of the up and down cell blocks 20 and 22 to sense amplifiers included in a sense amplifier array 18.

As shown in FIG. 2, the sense amplifier selection unit 16 includes an inverter IV1 for inverting the word line activation signal BSXD for the down cell block 22, and an NMOS transistor N1 switched on or off in response to the inverted signal outputted from the inverter IV1, thereby selectively generating an output signal as a signal BISU adapted to enable a connection between the up cell block 20 and the sense amplifiers. The sense amplifier selection unit 16 also includes an inverter IV2 for inverting the word line activation signal BSXU for the down cell block 22, and an NMOS transistor N2 switched on or off in response to the inverted signal outputted from the inverter IV2, thereby selectively generating an output signal as a signal BISD adapted to enable a connection between the down cell block 22 and the sense amplifiers. The sense amplifier selection unit 16 further includes a pair of PMOS transistors P1 and P2 connected in series between output terminals of the sense amplifier selection unit 16 from which the signals BISU and BISD are outputted, respectively. A high voltage source VPP is coupled to a node A1 between the PMOS transistors P1 and P2. A NAND gate ND1 is coupled at an output terminal thereof to respective gates of the PMOS transistors P1 and P2. The NAND gate ND1 serves to carry out a NANDing operation for the signals BSXU and BSXD.

When the signals BXSU and BSXD, each of which initially has a high level, are inputted to the sense amplifier selection unit 16, the NAND gate ND1 outputs a low-level signal in response to the input signals BSXU and BSXD. In accordance with the low-level signal from the NAND gate ND1, both the PMOS transistors P1 and P2 turn on, thereby generating output signals having the same level as that of the high voltage source VPP as the signals BISU and BISD. When only one of the input signals BSXU and BSXD, for example, the input signal BSXU adapted to activate the word lines of the up cell block 20, is switched to a low level, the NMOS transistor N2 is rendered to turn on. As a result, the level of the output signal BISD is switched to a ground voltage level. At this time, the NMOS transistor N1 is turned off, so that the output signal BISU is maintained at a high voltage level. On the other hand, both the PMOS transistors P1 and P2 are turned off because the output signal from the NAND gate ND1 has a high level. In this state, accordingly, the up cell block 20 is connected to the sense amplifiers.

The above mentioned operation is associated with the connection between the up cell block 20 and the sense amplifiers. The operation for the connection between the down cell block 22 and the sense amplifiers is carried out in a manner similar to that of the above-mentioned operation.

Now, the operation of the self-refresh apparatus will be described with reference to a timing diagram illustrated in FIG. 3.

The clock signal CLK has a clock pulse of a desired width generated every time the precharge signal PRECHG is switched to its disable state. This clock signal CLK is inputted, as a control signal, to the refresh counter 10. In response to every clock pulse of the clock signal CLK, the refresh counter 10 increments an address value by one. The refresh counter 10 generates the cell block selection address signals BSAU and BSAD when it counts a predetermined number of clock pulses, and outputs those cell block selection address signals BSAU and BSAD to the block selection units 12 and 14, respectively.

The block selection unit 12 carries out an ANDing operation for the cell block selection address signals BSAU and the precharge signal PRECHG, thereby generating an output signal, namely, the signal BSXU, which is, in turn, applied to the sense amplifier selection unit 16. On the other hand, the block selection unit 14 carries out an ANDing operation for the cell block selection address signals BSAD and the precharge signal PRECHG, thereby generating an output signal, namely, the signal BSXD, which is, in turn, applied to the sense amplifier selection unit 16.

The sense amplifier connect signals BISU and BISD, which are outputted from the sense amplifier selection unit 16, selectively have a high level in accordance with a computation conducted in the sense amplifier selection unit 16. In response to the sense amplifier connect signal BISU or BISD having a high level, a corresponding one of the cell blocks 20 and 22 is coupled to the sense amplifiers.

For instance, when the precharge signal PRECHG is switched to its disable state under the condition in which the cell block selection address signal BSAU is in an active state, the signal BSXU outputted from the block selection unit 12 is rendered to be active, thereby causing the signal BISU outputted from the sense amplifier selection unit 16 to be active. In this state, bit lines BITU and BITBU of the up cell block 20 are connected to an associated one of the sense amplifiers which, in turn, conducts a sensing operation for an associated one of the cells in the up cell block 20, thereby refreshing the associated cell. When the precharge signal PRECHG is switched to its active state after the refresh of the cells, the signal BSXU is switched to its disable state, thereby causing the signal BISU to be switched to its disable state.

Similarly, when the precharge signal PRECHG is switched to its disable state under the condition in which the cell block selection address signal BSAD is in an active state, the signal BISD outputted from the sense amplifier selection unit 16 is rendered to be active. When the precharge signal PRECHG is subsequently switched to its active state, the signal BISD is switched to its disable state.

As apparent from the above description, the signals BISU and BISD adapted to connect the associated cell blocks to the sense amplifiers are switched to their charge state or their discharge state every time each word line of the associated cell blocks is switched between its active state and its precharge state even if the associated cell block selection address signals BSAU and BSAD do not vary. This results in an increase in the capacitance required for the driving of the cell blocks because a number of sense amplifiers are coupled to those signals BSAU and BSAD. For this reason, there is a problem in that a large amount of electric power is consumed in the charge operation.

SUMMARY OF THE INVENTION

Therefore, the present invention has been made in view of the above mentioned problem involved in the related art, and an object of the invention is to provide a self refresh apparatus in a semiconductor memory device which is capable of reducing the amount of electric power consumed in a self refresh operation.

In accordance with the present invention, this object is accomplished by providing In a semiconductor memory device including up and down cell blocks vertically arranged, and an array of sense amplifiers interposed between the cell blocks, the up and down cell blocks being selectively connected to the sense amplifiers in accordance with associated sense amplifier connection signals, respectively, a self refresh apparatus comprising: a refresh counter for generating word line selection signals and cell block selection signals required for a refresh operation in a self refresh mode for the cell blocks, respectively; block selection means for receiving a precharge signal along with the cell block selection signals, thereby selecting desired ones of the cell blocks respectively associated with the cell block selection signals while determining whether the selected cell blocks are in an active state or in a precharge state, respectively; sense amplifier selection control means for determining a variation in each of the sense amplifier connection signals in accordance with a variation in an associated one of the cell block selection signal; and sense amplifier selection means for controlling a potential level of each of the sense amplifier connection signals under a control of the sense amplifier selection control means.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
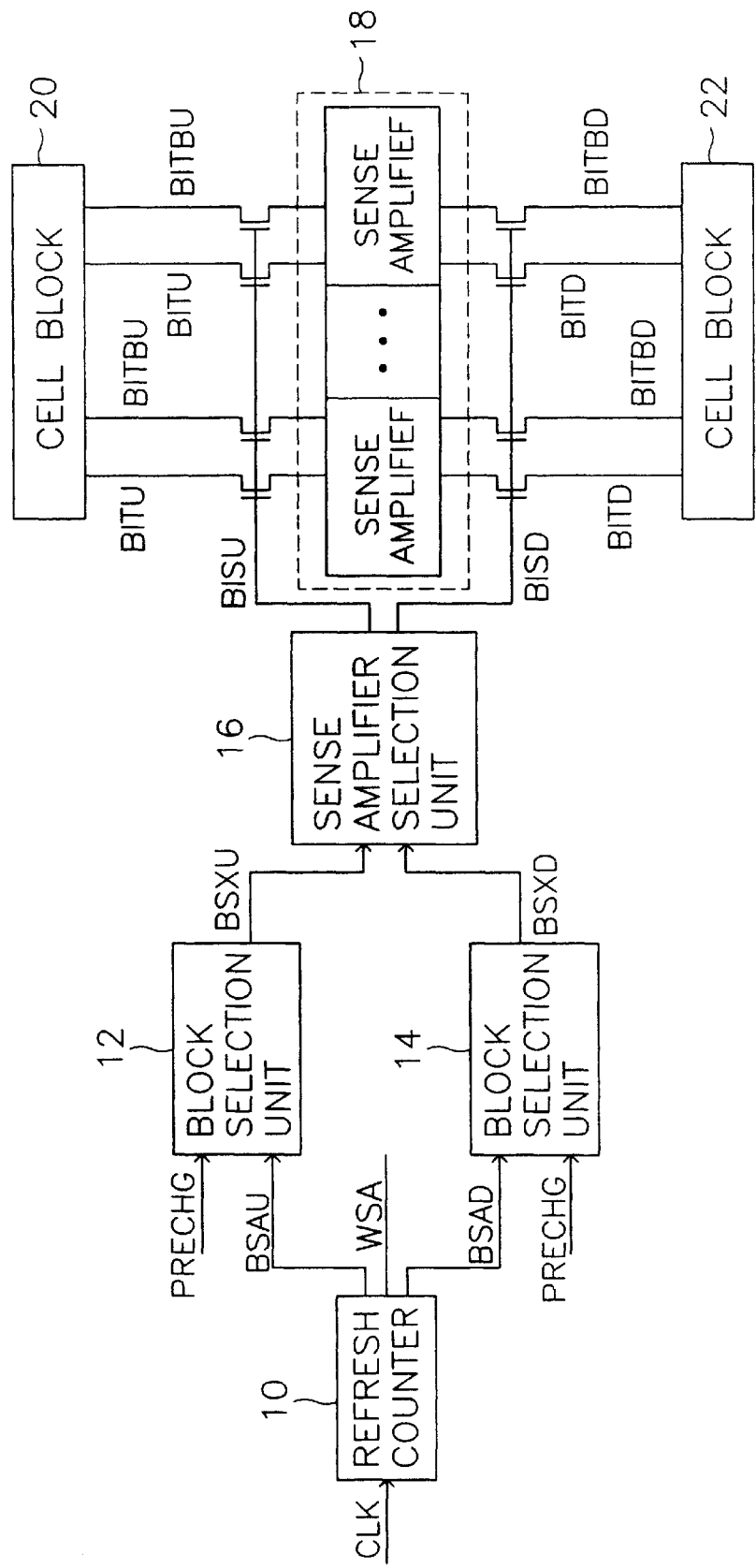
FIG. 1 is a block diagram illustrating a conventional self refresh apparatus in a DRAM using a shared sense amplifier system.
Figure 2:
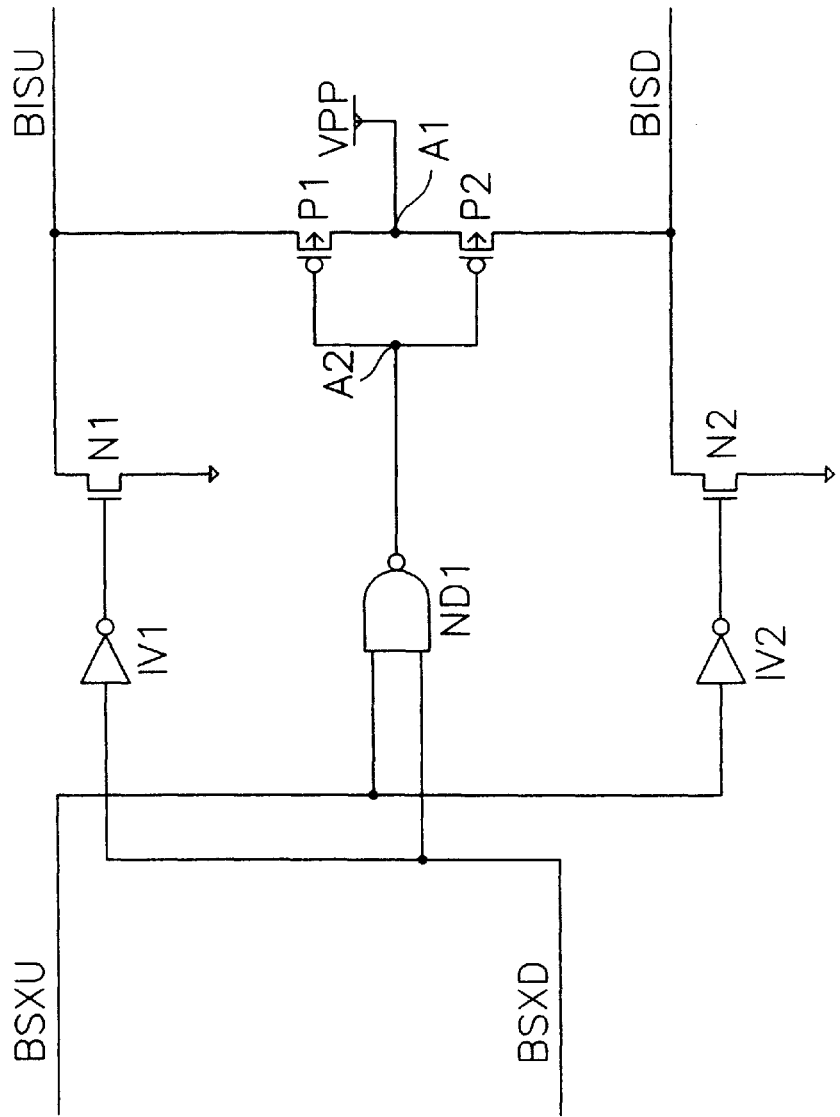
FIG. 2 is a circuit diagram illustrating a sense amplifier selection unit shown in FIG. 1.
Figure 3:
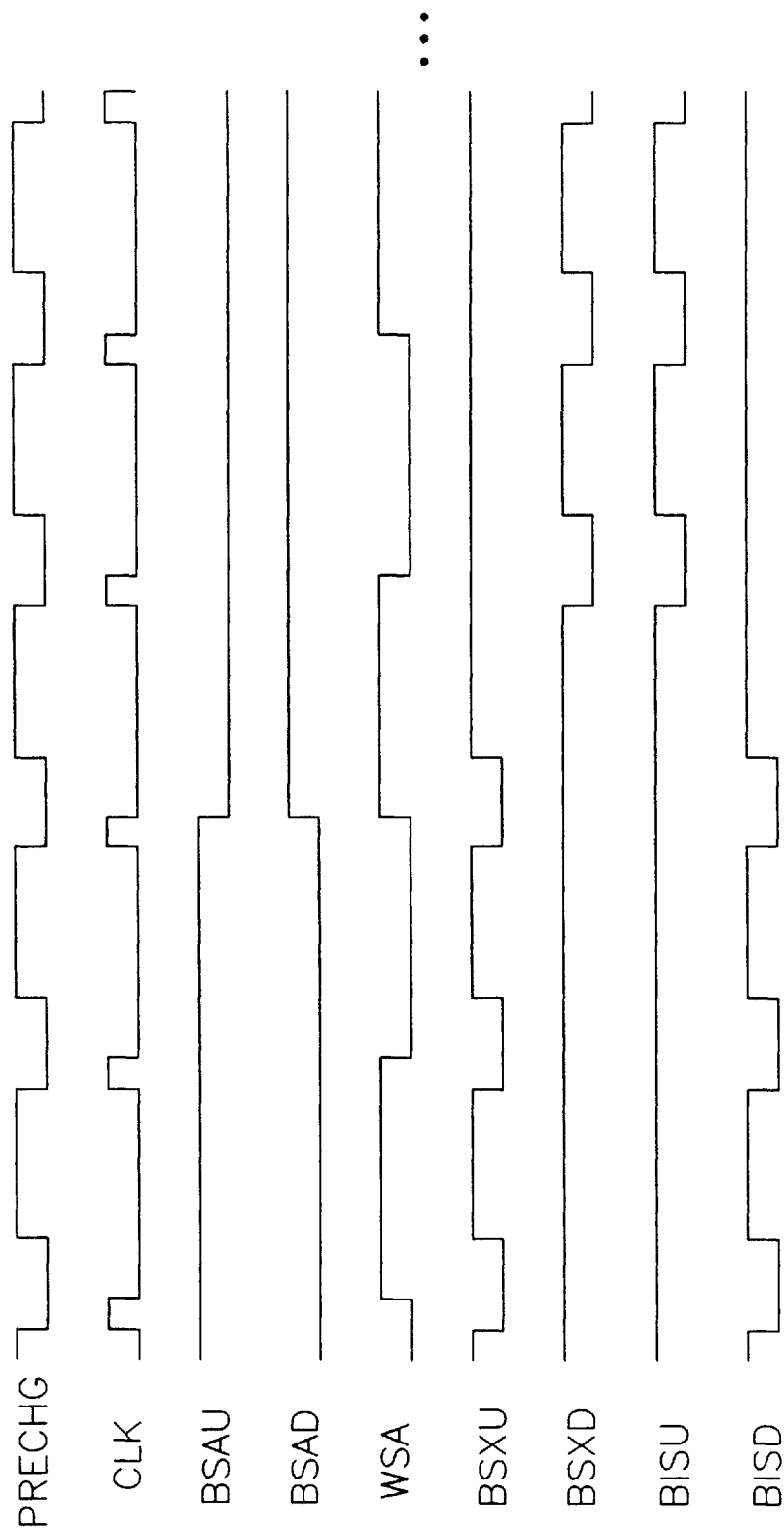
FIG. 3 is a timing diagram of the configuration illustrated in FIG. 1.
Figure 4:
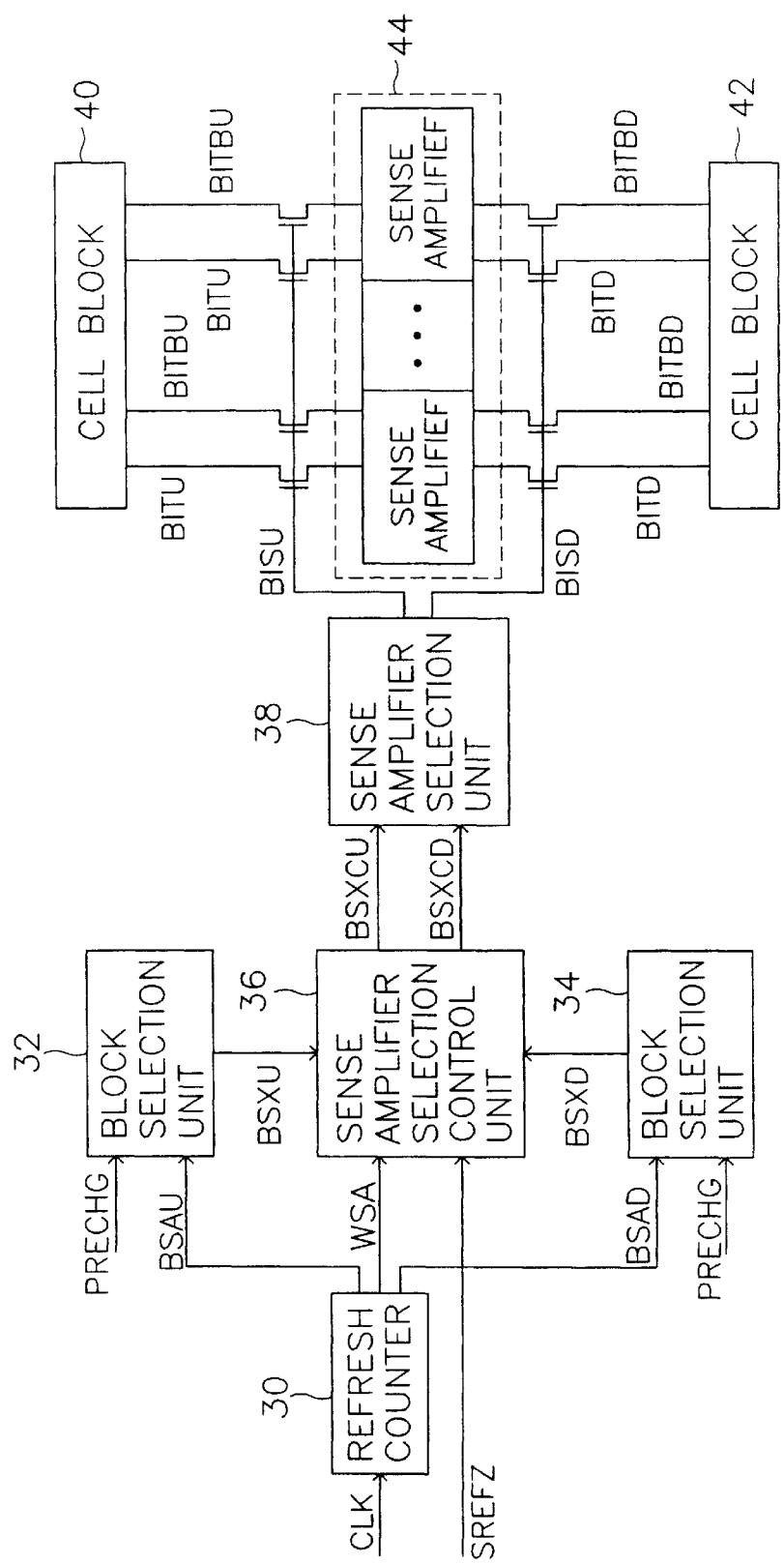
FIG. 4 is a self refresh apparatus according to an embodiment of the present invention.

FIG. 4 is a self-refresh apparatus according to an embodiment of the present invention. This self-refresh apparatus is applied to a semiconductor memory device including up and down cell blocks, and an array of sense amplifiers interposed between the cell blocks. The up and down cell blocks are selectively connected to the sense amplifiers in accordance with associated sense amplifier connection signals, respectively. As shown in FIG. 4, the self refresh apparatus includes a refresh counter 30 for receiving an external clock signal CLK in a self refresh mode, and generating word line selection signals WSA, adapted to select word lines of cell blocks, and cell block selection signals BSAU and BSAD in response to the received clock signal CLK, in order to conduct a refresh operation. The self refresh apparatus also includes block selection units 32 and 34 for receiving a precharge signal PRECHG and respective block selection signals BSAU and BSAD, thereby selecting associated ones of the cell blocks while determining whether the selected cell blocks are to be activated or precharged, respectively. The self refresh apparatus further includes a sense amplifier selection control unit 36 for receiving signals BSXU and BSXD, outputted from respective block selection units 32 and 34, and determining a variation in a sense amplifier connection signal BISU or BISD in accordance with a variation in an associated one of the cell block selection signals BSAU and BSAD. A sense amplifier selection unit 38 is also provided which controls the potential level of each of the sense amplifier connection signals BSAU and BSAD under the control of the sense amplifier selection control unit 36. The sense amplifier array, which is denoted by the reference numeral 44, includes a plurality of sense amplifiers. The up and down cell blocks, which are denoted by respective reference numerals 40 and 42, share the sense amplifier array 44 with each other.

Figure 5:
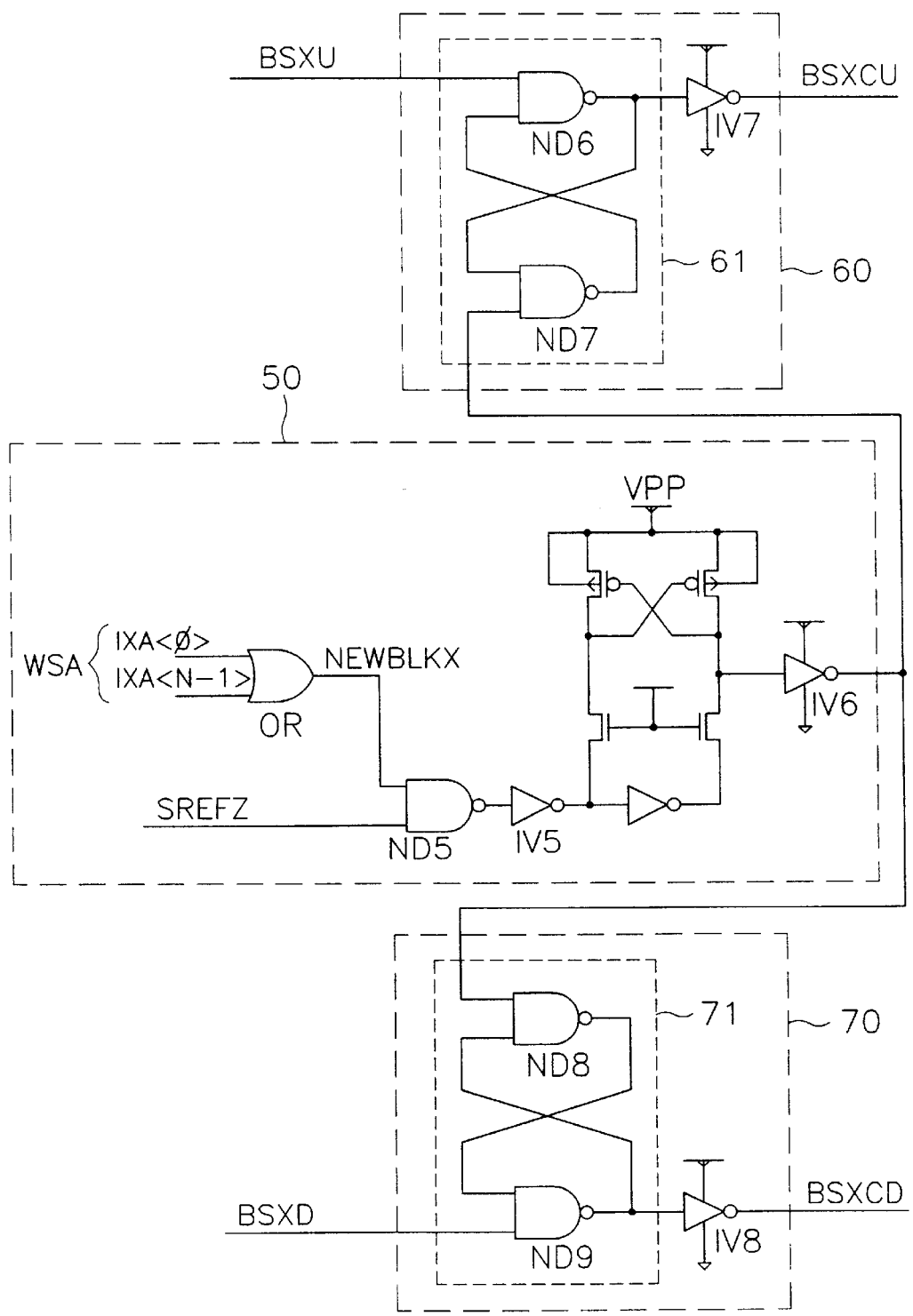
FIG. 5 is a circuit diagram illustrating a sense amplifier selection control unit shown in FIG. 4.

As shown in FIG. 5, the sense amplifier selection control unit 36 includes a sensing unit 50 for sensing respective levels of the word line selection signals WSA in the self refresh mode, a decoding unit 60 for combining an output signal from the sensing unit 50 with the output signal from the block selection unit 32, and applying the resultant combined signal to the sense amplifier selection unit 38, and a decoding unit 70 for combining the output signal from the sensing unit 50 with the output signal from the block selection unit 32, and applying the resultant combined signal to the sense amplifier selection unit 38.

The sensing unit 50 includes a decoder having an OR gate OR for receiving the word line selection signals WSA, as inputs thereof, and an AND logic for ANDing an output signal from the OR gate OR and the self refresh signal SREFZ. The AND logic includes a NAND gate ND5 and an inverter IV5. The sensing unit 50 also includes a cross-coupled differential amplifier for stabilizing an output signal from the decoder.

The decoding unit 60 includes a NAND latch 61, and an inverter IV7 for inverting an output signal from the NAND latch 61. The NAND latch 61 includes a pair of two-input NAND gates ND6 and ND7 cross-coupled to each other in such a fashion that the output of one NAND gate is coupled to one input of the other NAND gate. In the illustrated case, the NAND gate ND6 receives the output signal BSXU from the block selection unit 32, as the other input thereof, whereas the NAND gate ND7 receives the output signal from the sensing unit 50, as the other input thereof. Similarly, The decoding unit 70 includes a NAND latch 71, and an inverter IV8 for inverting an output signal from the NAND latch 71. The NAND latch 71 includes a pair of two-input NAND gates ND8 and ND9 cross-coupled to each other. In the illustrated case, the NAND gate ND8 receives the output signal from the sensing unit 50, as the other input thereof, whereas the NAND gate ND9 receives the output signal BSXD from the block selection unit 34, as the other input thereof.

Figure 6:
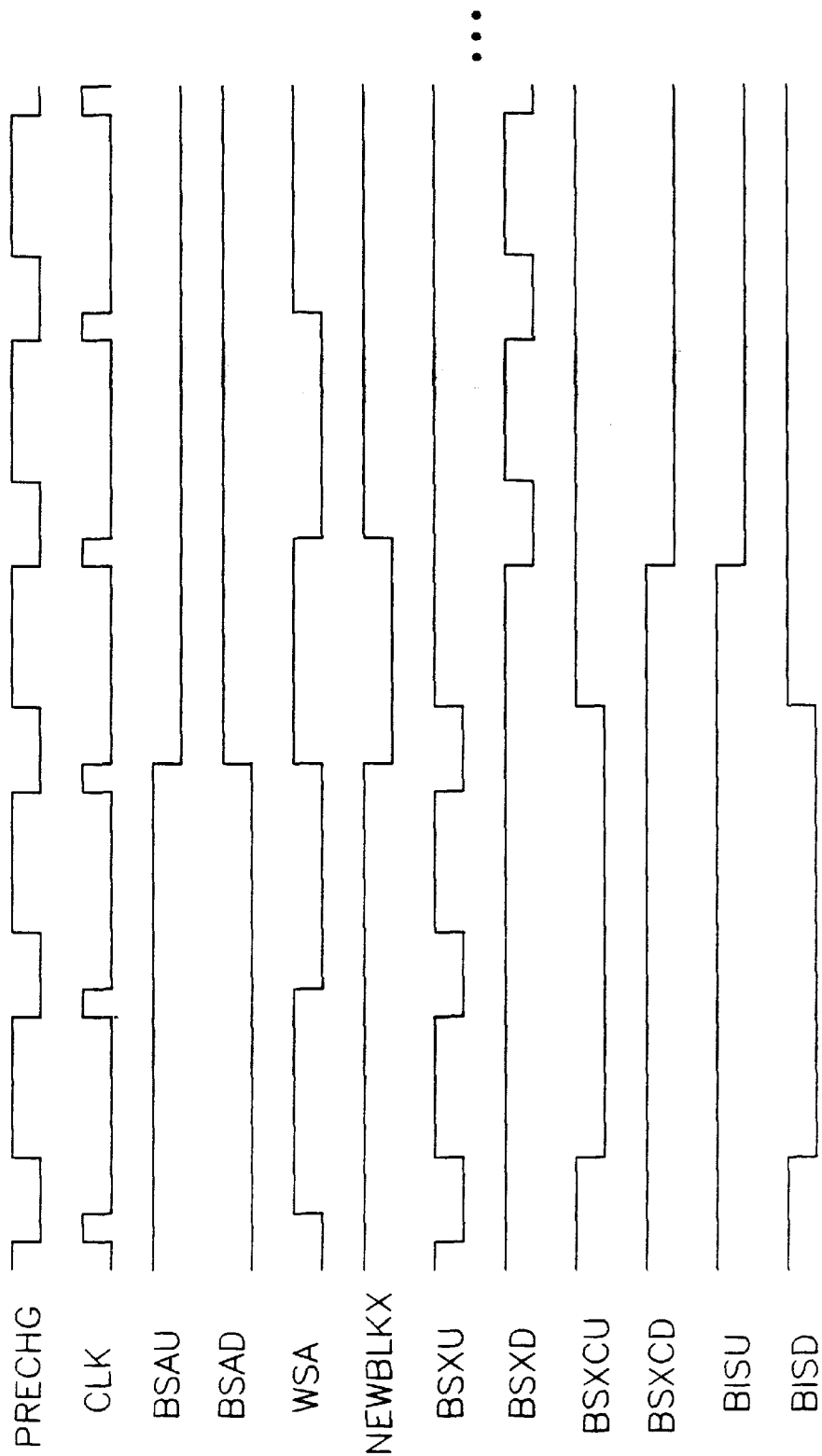
FIG. 6 is a timing diagram of the configuration illustrated in FIG. 4.

Now, the operation of the self-refresh apparatus according to the illustrated embodiment of the present invention will be described with reference to a timing diagram illustrated in FIG. 6.

First, the description will be made in conjunction with the case wherein a semiconductor memory device, to which the self-refresh apparatus is applied, is not in a self-refresh mode.

In this case, the self-refresh signal SREFZ, which is applied to the sense amplifier selection control unit 36, has a low potential level. As a result, the NAND gate ND5, which receives the self refresh signal SREFZ at one input thereof, outputs a signal of a high logic level irrespective of the level of each word line selection signal WSA which is an address input from the refresh counter 30. Accordingly, the inverter IV6 outputs a signal of a low logic level. By virtue of the output signal from the inverter IV6, the NAND gates ND7 and ND8 generate output signals of a high logic level. Since.the high-level signal from the NAND gate ND7 is applied to one input of the NAND gate ND6, another input signal applied to the other input of the NAND gate ND6, that is, the signal BSXU, is inverted. As a result, the inverter IN7 outputs a signal BSXCU which has the same logic level as the signal BSXU. That is, the logic level of the signal BSXU is maintained. For the signal BSXD, the same result as that for the signal BSXU is obtained. Thus, the self-refresh apparatus operates in the same fashion as in conventional cases.

Next, the operation of the self-refresh apparatus in the self-refresh mode will be described.

When the semiconductor memory device is in the self refresh mode, the self refresh signal SREFZ, which is applied to the sense amplifier selection control unit 36, has a high potential level.

When a row address currently outputted is begun to be activated, the refresh counter 30 outputs the next row address after a pulse width of the clock signal CLK. In response to the activation of the row address, the block selection units 32 and 34 latch respective cell block selection signals BSAU and BSAD outputted from the refresh counter 30. Under the condition in which a desired block has been selected, each of the block selection units 32 and 34 outputs a signal BSXU or BSXD of a low logic level.

As a result, when the word line selection signals WSA are not indicative of any row address associated with the last line in each cell block, the OR gate OR outputs a signal NEWBLKX of a high logic level, that is, a disable state, because the word line selection signals WSA have at least one bit of a high logic value even after the pulse width of the clock signal CLK applied to the refresh counter 30. Accordingly, the NAND gate ND5 outputs a signal of a low logic level, and the inverter IV5 outputs a signal of a high logic level.

In this case, assuming that the signal BSAU for selecting the up cell block 40 is activated, that is, it has a high logic value (in this case, the signal BSAD has a low logic level), the output signal BSXU of the block selection unit 32 is maintained at a low logic level until the precharge signal PRECHG is rendered to be active. As a result, the NAND gate ND6 outputs a signal of a high logic level, and the output signal BSXCU of the inverter IV7 is rendered to be active with a low logic level.

Thereafter, the sense amplifier connection signal BISD outputted from the sense amplifier selection unit 38 is rendered to be disabled, that is, it has a low logic level. On the other hand, the sense amplifier connection signal BISU is rendered to be active, so that it has a high logic level. Also, the NAND gate ND7 outputs a signal having a low logic level.

When the precharge signal PRECHG is rendered to be active in response to the beginning of a precharge interval after the completion of the row activation interval, the output signal BSXU of the block selection unit 32 is rendered to be disabled, so that it has a high logic level. However, the output of the NAND gate ND6 is maintained at a high logic level, that is, it is in a latched state, because the output of the NAND gate ND7 has a low logic level. In this case, accordingly, there is no variation in the sense amplifier connection signals BISU and BISD.

Thus, the sense amplifier connection signals BISU and BISD maintain their logic states, once set, when there is no variation in the cell block selection signals BSAU and BSAD Assuming that the word line selection signals WSA are indicative of row addresses associated with the last line in each cell block, all bits of the word line selection signals WSA are converted to have a low logic level during the activation of the row addresses. As a result, the output NEWBLKX of the OR gate OR is rendered to be active with a low logic level. Accordingly, the output of the NAND gate ND5 is rendered to have a high logic level, and the output of the inverter IV5 has a low logic level. This causes the NAND gates ND7 and ND8 to generate output signals of a high logic level, respectively. Accordingly, the NAND gates ND6 and ND9 invert input signals BSXU and BSXD, respectively.

Thus, when the precharge signal PRECHG is rendered to be active, that is, when the word line activation signals BSXU and BSXD are rendered to be disabled with a high logic level, the signals BSXCU and BSXCD outputted from the sense amplifier selection control unit 36 are rendered to be disabled with a high logic level, thereby causing the sense amplifier connection signals BISU and BISD to be disabled, as in the case in which the semiconductor memory device is not in the self refresh mode.

As apparent from the above description, in accordance with the present invention, the sense amplifier connection signals are varied in logic level only when the associated cell block selection signals vary in the self refresh mode, respectively. Accordingly, it is possible to reduce the electric power consumed in the self-refresh operation.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. In a semiconductor memory device including up and down cell blocks vertically arranged, and an array of sense amplifiers interposed between the cell blocks, the up and down cell blocks being selectively connected to the sense amplifiers in accordance with associated sense amplifier connection signals, respectively, a self refresh apparatus comprising:

a refresh counter for generating word line selection signals and cell block selection signals required for a refresh operation in a self refresh mode for the cell blocks, respectively;

block selection means for receiving a precharge signal along with the cell block selection signals, thereby selecting desired ones of the cell blocks respectively associated with the cell block selection signals while determining whether the selected cell blocks are in an active state or in a precharge state, respectively;

sense amplifier selection control means for determining a variation in each of the sense amplifier connection signals in accordance with a variation in an associated one of the cell block selection signal; and sense amplifier selection means for controlling a potential level of each of the sense amplifier connection signals under a control of the sense amplifier selection control means.

2. The self refresh apparatus according to claim 1, wherein the sense amplifier selection control means comprises:

a sensing means for sensing a level of each of the word line selection signals in the self refresh mode; and a decoding means for combining a signal outputted from the sensing means with a signal outputted from the block selection means, and applying the resultant combined signal to the sense amplifier selection means.

3. The self refresh apparatus according to claim 2, wherein the sensing unit comprises:

a decoder for receiving the word line selection signals along with a self refresh signal, and decoding the received signals; and a differential amplifier for stabilizing an output signal from the decoder.

4. The self refresh apparatus according to claim 3, wherein the decoder comprises:

an OR gate for receiving the word line selection signals as inputs thereof, respectively; and an AND logic for ANDing an output from the OR gate and the self refresh signal.

5. The self refresh apparatus according to claim 2, wherein the decoding means comprises:

a NAND latch for receiving an output signal from the sensing means along with the output signal from the block selection means; and an inverter for inverting an output signal from the NAND latch.

* * * * *